(12) United States Patent
Agarwal et al.

(10) Patent No.: US 6,891,217 B1
(45) Date of Patent: May 10, 2005

(54) CAPACITOR WITH DISCRETE DIELECTRIC MATERIAL

(75) Inventors: Vishnu K. Agarwal, Boise, ID (US); Garo J. Derderian, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/428,125

(22) Filed: Oct. 26, 1999

Related U.S. Application Data

(62) Division of application No. 09/059,057, filed on Apr. 10, 1998, now Pat. No. 6,730,559.

(51) Int. Cl.$^7$ .................... H01L 27/108; H01L 21/8242
(52) U.S. Cl. ...................................... 257/310; 438/240
(58) Field of Search ............................ 257/310, 306; 257/240; 438/240

(56) References Cited

U.S. PATENT DOCUMENTS

| | | |
|---|---|---|
| 3,210,607 A | 10/1965 | Flanagan |
| 3,691,537 A | 9/1972 | Burgess et al. |
| 3,755,692 A | 8/1973 | Mundy |
| 3,886,415 A | 5/1975 | Genthe |
| 4,333,808 A | 6/1982 | Bhattacharyya et al. |
| 4,437,139 A | 3/1984 | Howard |
| 4,464,701 A | 8/1984 | Roberts et al. |
| 4,873,610 A | 10/1989 | Shimizu et al. |
| 4,891,682 A | 1/1990 | Yusa et al. .................. 357/30 |
| 4,952,904 A | 8/1990 | Johnson et al. |
| 5,053,917 A | 10/1991 | Miyasaka et al. |
| 5,079,191 A | 1/1992 | Shinriki et al. |
| 5,142,438 A | 8/1992 | Reinberg et al. |
| 5,191,510 A | 3/1993 | Huffman |
| 5,192,871 A | 3/1993 | Ramakrishnan et al. |
| 5,234,556 A | 8/1993 | Oishi et al. |
| 5,279,985 A | 1/1994 | Kamiyama .................. 437/60 |

(Continued)

FOREIGN PATENT DOCUMENTS

| | | | |
|---|---|---|---|
| JP | 1-222469 A | 5/1989 | |
| JP | 403209869 A | 9/1991 | |
| JP | 04162527 A | 6/1992 | |
| JP | 5211288 A | 8/1993 | |
| JP | 05-221644 | 8/1993 | |
| JP | 405211288 A | 8/1993 | |
| JP | 405243524 A | 9/1993 | |
| JP | 405343641 | 12/1993 | ................. 257/310 |
| JP | 06-021333 | 1/1994 | |
| JP | 406061449 A | 3/1994 | |
| JP | 7161827 A | 6/1995 | |
| WO | WO 97/44797 | 11/1997 | |

OTHER PUBLICATIONS

IBM Technical Disclosure Bulletin: "Process for Selective Etching of Tantalum Oxide", vol. 27, No. 12, May 1985, one page.

(Continued)

*Primary Examiner*—Amir Zarabian
*Assistant Examiner*—Kiesha Rose
(74) *Attorney, Agent, or Firm*—Wells St. John P.S.

(57) ABSTRACT

The invention includes methods of forming capacitors and capacitor constructions. In one implementation, a method of forming a capacitor includes forming a first capacitor electrode. A first layer of a first capacitor dielectric material is formed over the first capacitor electrode. A second layer of the first capacitor dielectric material is formed on the first layer. A second capacitor electrode is formed over the second layer of the first capacitor dielectric material. A capacitor in accordance with an implementation of the invention includes a pair of capacitor electrodes having capacitor dielectric material therebetween comprising a composite of two immediately juxtaposed and contacting, yet discrete, layers of the same capacitor dielectric material.

11 Claims, 3 Drawing Sheets

U.S. PATENT DOCUMENTS

| | | |
|---|---|---|
| 5,293,510 A | 3/1994 | Takenaka |
| 5,316,982 A | 5/1994 | Taniguchi |
| 5,330,935 A | 7/1994 | Dobuzinsky et al. |
| 5,335,138 A | 8/1994 | Sandhu et al. ............. 361/303 |
| 5,348,894 A | 9/1994 | Gnade et al. |
| 5,352,623 A | 10/1994 | Kamiyama |
| 5,362,632 A | 11/1994 | Mathews |
| 5,372,859 A | 12/1994 | Thakoor ..................... 427/551 |
| 5,390,072 A | 2/1995 | Anderson et al. |
| 5,397,446 A | 3/1995 | Ishihara et al. |
| 5,411,912 A | 5/1995 | Sakamoto |
| 5,438,012 A | 8/1995 | Kamiyama |
| 5,442,213 A | 8/1995 | Okudaira |
| 5,442,585 A | 8/1995 | Eguchi et al. |
| 5,452,178 A | 9/1995 | Emesh et al. ............... 361/303 |
| 5,466,629 A | 11/1995 | Mihara et al. ................ 437/60 |
| 5,468,687 A | 11/1995 | Carl et al. |
| 5,471,364 A | 11/1995 | Summerfelt et al. |
| 5,504,041 A | 4/1996 | Summerfelt |
| 5,508,221 A | 4/1996 | Kamiyama |
| 5,508,953 A | 4/1996 | Fukuda et al. |
| 5,510,651 A | 4/1996 | Maniar et al. ............... 257/751 |
| 5,552,337 A | 9/1996 | Kwon et al. |
| 5,555,486 A | 9/1996 | Kingon et al. .............. 361/305 |
| 5,557,122 A | 9/1996 | Shrivastava et al. |
| 5,561,307 A | 10/1996 | Mihara et al. |
| 5,580,812 A | 12/1996 | Ikemasu et al. |
| 5,585,300 A | 12/1996 | Summerfelt |
| 5,617,290 A | 4/1997 | Kulwicki et al. |
| 5,641,702 A | 6/1997 | Imai et al. |
| 5,654,222 A | 8/1997 | Sandhu et al. |
| 5,661,319 A * | 8/1997 | Fujii et al. .................. 257/295 |
| 5,663,088 A | 9/1997 | Sandhu et al. |
| 5,665,210 A | 9/1997 | Yamazaki |
| 5,668,040 A | 9/1997 | Byun ......................... 438/396 |
| 5,675,028 A | 10/1997 | Neumayer et al. |
| 5,688,724 A | 11/1997 | Yoon et al. |
| 5,723,382 A | 3/1998 | Sandhu et al. |
| 5,728,603 A | 3/1998 | Emesh et al. |
| 5,753,547 A | 5/1998 | Ying |
| 5,760,474 A | 6/1998 | Schuele |
| 5,780,115 A * | 7/1998 | Park et al. .................. 427/539 |
| 5,780,359 A | 7/1998 | Brown et al. |
| 5,783,253 A * | 7/1998 | Roh ............................ 427/81 |
| 5,786,248 A | 7/1998 | Schuegraf |
| 5,790,366 A | 8/1998 | Desu et al. |
| 5,798,903 A | 8/1998 | Dhote et al. |
| 5,807,774 A | 9/1998 | Desu et al. .................. 438/240 |
| 5,814,852 A | 9/1998 | Sandhu et al. ............. 257/310 |
| 5,834,060 A | 11/1998 | Kawahara et al. |
| 5,834,345 A | 11/1998 | Shimizu ..................... 438/158 |
| 5,837,591 A | 11/1998 | Shimada et al. |
| 5,837,593 A | 11/1998 | Park et al. |
| 5,838,035 A | 11/1998 | Ramesh |
| 5,843,830 A | 12/1998 | Graettinger et al. |
| 5,844,771 A | 12/1998 | Graettinger et al. ........ 361/303 |
| 5,858,873 A | 1/1999 | Vitkavage et al. |
| 5,864,496 A | 1/1999 | Mueller et al. |
| 5,876,788 A | 3/1999 | Bronner |
| 5,888,295 A | 3/1999 | Sandhu et al. ................ 117/89 |
| 5,899,740 A | 5/1999 | Kwon |
| 5,910,218 A | 6/1999 | Park et al. |
| 5,910,880 A | 6/1999 | DeBoer et al. ............. 361/311 |
| 5,913,125 A | 6/1999 | Brouillette et al. |
| 5,916,634 A | 6/1999 | Fleming et al. |
| 5,920,775 A | 7/1999 | Koh |
| 5,930,106 A | 7/1999 | Deboer et al. |
| 5,930,584 A | 7/1999 | Sun et al. |
| 5,933,316 A | 8/1999 | Ramakrishnan et al. .... 361/311 |
| 5,943,580 A | 8/1999 | Ramakrishnan |
| 5,955,758 A | 9/1999 | Sandhu et al. ............... 257/306 |
| 5,970,369 A | 10/1999 | Hara et al. .................. 438/488 |
| 5,973,911 A | 10/1999 | Nishioka |
| 5,985,714 A | 11/1999 | Sandhu et al. |
| 5,990,507 A | 11/1999 | Mochizuki et al. ......... 257/295 |
| 5,998,247 A | 12/1999 | Wu |
| 6,010,744 A | 1/2000 | Buskirk et al. ............... 427/81 |
| 6,010,931 A | 1/2000 | Sun et al. |
| 6,015,989 A | 1/2000 | Horikawa et al. .......... 257/309 |
| 6,017,789 A | 1/2000 | Sandhu et al. |
| 6,027,969 A | 2/2000 | Huang et al. ............... 438/254 |
| 6,028,359 A | 2/2000 | Merchant et al. |
| 6,028,360 A | 2/2000 | Nakamura et al. .......... 257/758 |
| 6,037,205 A | 3/2000 | Huh et al. |
| 6,046,469 A | 4/2000 | Yamazaki et al. .......... 257/306 |
| 6,048,764 A | 4/2000 | Suzuki et al. |
| 6,051,859 A | 4/2000 | Hosotani et al. ............ 257/306 |
| 6,054,730 A | 4/2000 | Noguchi ..................... 257/306 |
| 6,081,034 A | 6/2000 | Sandhu et al. |
| 6,090,659 A | 7/2000 | Laibowitz et al. |
| 6,093,966 A | 7/2000 | Venkatraman et al. |
| 6,096,597 A | 8/2000 | Tsu et al. |
| 6,143,597 A * | 11/2000 | Matsuda et al. ............ 438/240 |
| 6,150,208 A | 11/2000 | Deboer et al. |
| 6,150,706 A | 11/2000 | Thakur et al. |
| 6,168,985 B1 | 1/2001 | Asano et al. |
| 6,180,481 B1 | 1/2001 | DeBoer |
| 6,197,653 B1 | 3/2001 | Khamankar |
| 6,201,728 B1 | 3/2001 | Narui et al. |
| 6,204,203 B1 | 3/2001 | Narwankar et al. |
| 6,235,594 B1 | 5/2001 | Merchant et al. |
| 6,275,370 B2 * | 8/2001 | Gnade et al. ............. 367/321.1 |
| 6,282,080 B1 | 8/2001 | DeBoer et al. |
| 6,376,332 B1 | 4/2002 | Yanagita et al. |
| 6,727,143 B1 | 4/2004 | Hui et al. |

OTHER PUBLICATIONS

U.S. Appl. No. 09/512,149, filed Feb. 23, 2000, Agarwal.

Chang et al.; "Structures of tantalum pentoxide thin films formed by reactive sputtering of Ta metal",Elseview Science S.A. 1995, Thin Solid Films pp. 56–63.

Van Zant, "Microchip Fabrication: A Practical Guide to Semiconductor Processing" 4th Edition, McGraw Hill 2000, pp. 388–389.

H. Shinriki and M. Nakata, IEEE Transaction On Electron Devices vol. 38 No. 3 Mar. 1991.

U.S. Appl. No. 09/033,063, filed Feb. 28, 1998, Al–Shareef et al.

U.S. Appl. No. 09/033,064, filed Feb. 28, 1998, Al–Shareef et al.

U.S. Appl. No. 09/058,612, filed Apr. 10, 1998, Agarwal et al.

U.S. Appl. No. 09/083,257, filed May 21, 1998, Al–Shareef et al.

U.S. Appl. No. 09/137,780, filed Aug. 20, 1998, Al–Shareef et al.

U.S. Appl. No. 09/074,638, filed May 7, 1998, Agarwal et al.

U.S. Appl. No. 08/858,027, filed May 16, 1997, Sandhu et al.

U.S. Appl. No. 08/881,561, filed Jun. 24, 1997, Sandhu et al.

U.S. Appl. No. 09/086,389, filed May 28, 1998, Sandhu et al.

U.S. Appl. No. 09/122,473, filed Jul. 23, 1998, Schuegraf.

U.S. Appl. No. 09/098,035, filed Jun. 15, 1998, Deboer et al.

U.S. Appl. No. 09/185,412, filed Nov. 3, 1998, Graettinger et al.

U.S. Appl. No. 09/229,518, filed Jan. 13, 1999, DeBoer et al.
U.S. Appl. No. 08/994,054, filed Aug.1997, Parekh et al.
U.S. Appl. No. 08/670,644, Graettinger et al.
U.S. Appl. No. 08/542,430, Schuegraf.

McIntyre, Paul C. et al., *Kinetics and Mechanisms of TiN Oxidation Beneath Pi.TiN Films.* J. Appl. Phys., vol. 82, No. 9, pp. 4577–4585 (Nov. 1997).

Lesaicherre, P–Y et al., *a Gbit–Scale DRAM Stacked Capacitor Technology with ECR MOCVD $SrTiO_3$ and RIE Patterned $RuO_2$/TIN Storage Nodes*, 1994 IEEE, pp. 831–834.

Onishi, Shigeo et al., *Half–Micron Ferroelectric Memory Cell Technology With Stacked Capacitor Structure*, 1994 IEEE, IDEM 94–843, pp. 843–846.

Kamiyama, S. et al., *Ultrathin Tantalum Oxide Capacitor Dielectric Layers Fabricated Using Rapid Thermal Nitrodation Prior to Low Pressure Chemical Vapor Deposition*, J. Electrochem. Soc., vol. 140, No. 6, Jun. 1993, pp. 1617–1625.

Eimori, T. et al., *A Newly Designed Planar Stacked Capacitor Cell with High Dielectric Constant Film for 256Mbit Dram*, 1993 IEEE, pp. 631–634.

Yamaguchi, H. et al., *Structural and Electrical Characterization of $SrTiO_3$ Thin Films Prepared by Metal Organic Chemical Vapor Deposition*, Jpn. J. appl. Phys., vol. 32, 1993, Pt. 1, No. 9B, pp. 4069–4073.

Fazan, P.C. et al., *A High–C Capacitor ($20.4 fF/\mu m^2$) with Ultrathin CVD–$Ta_2O_5$ Films Deposited on Rugged Poly–Si for High Density DRAMs*, 1992 IEEE, pp. 263–266.

Kamiyama, S., et. al., *Highly Reliable $2.5\mu m$ $Ta_2O_5$ Capacitor Process Technology for 256Mbit DRAMs*, 1991 IEEE, pp. 827–830.

Farooq, M.A. et al., *Tantalum nitride as a dissusion barrier between $Pd_2Si$, CoSi2 and aluminum*, 1989 American Institute of Physics, pp. 3017–3022.

S. Wolf and R.N. Tauber. *Silicon Processing for the VLSI Era*, vol. 2, Lattice Press. pages 589–591.

Anonymous Research Disclosure, 1989R D–0299041 titled *Double High Dielectric Capacitor*, Derewent–Week 198917 (Derwent World Patent Index).

* cited by examiner

CAPACITOR WITH DISCRETE DIELECTRIC MATERIAL

RELATED PATENT DATA

This application is a divisional of U.S. patent application Ser. No. 09/059,057 filed Apr. 10, 1998 now U.S. Pat. No. 6,730,559 entitled "Capacitors and Methods of Forming Capacitors", naming Vishnu K. Agarwal and Garo J. Derderian as inventors, the disclosure of which is incorporated by reference.

TECHNICAL FIELD

This invention relates to capacitors and to methods of forming capacitors.

BACKGROUND OF THE INVENTION

Typical capacitors comprise a pair of conductive electrodes spaced apart by intervening capacitor dielectric material. As integrated circuitry becomes denser and as individual electronic components such as capacitors get smaller, integrated circuitry fabricators face the challenge of developing capacitor constructions and materials which achieve desired capacitance despite the decreasing size. Example materials under consideration for capacitor dielectric layers include titanates and tantalum pentoxide. These and other capacitor dielectric layer materials can occur in crystalline and in amorphous phases.

It is generally known that the capacitance of dielectric materials such as these can, at least initially, be increased from their as-deposited form by annealing. Such annealing can promote crystallization, re-crystallization or crystal realignment which can facilitate increase in capacitance and reduction in current leakage through the material. However, such annealing can also cause single crystals to be formed in the dielectric layer which in essence extend entirely through the dielectric layer between the layer's opposing surfaces. Annealing or crystal formation to this degree can undesirably have the effect of increasing current leakage. This is primarily due to continuous paths being provided by the continuous grain boundaries for current leakage from one side of the layer to the other. It would be desirable to improve upon these adverse characteristics of capacitor dielectric layer materials.

SUMMARY OF THE INVENTION

The invention in one aspect includes methods of forming capacitors and to capacitor constructions. In one implementation, a method of forming a capacitor includes forming a first capacitor electrode. A first layer of a first capacitor dielectric material is formed over the first capacitor electrode. A second layer of the first capacitor dielectric material is formed on the first layer. A second capacitor electrode is formed over the second layer of the first capacitor dielectric material. In accordance with another implementation, the first layer comprises a first titanate compound comprising capacitor dielectric material and the second layer comprises a different second titanate compound comprising capacitor dielectric material. A capacitor in accordance with an implementation of the invention includes a pair of capacitor electrodes having capacitor dielectric material therebetween comprising a composite of two immediately juxtaposed and contacting, yet discrete, layers of the same capacitor dielectric material. A capacitor in accordance with another implementation includes a pair of capacitor electrodes having capacitor dielectric material therebetween comprising a composite of two immediately juxtaposed and contacting, yet discrete, layers of two different capacitor dielectric materials, said two capacitor dielectric materials including two different titanate compounds. A capacitor in accordance with still another implementation includes a pair of capacitor electrodes having capacitor dielectric material therebetween comprising a composite of two immediately juxtaposed and contacting, yet discrete, layers of two different capacitor dielectric materials, one of the two different materials comprising a titanate compound and the other comprising $Ta_2O_5$.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
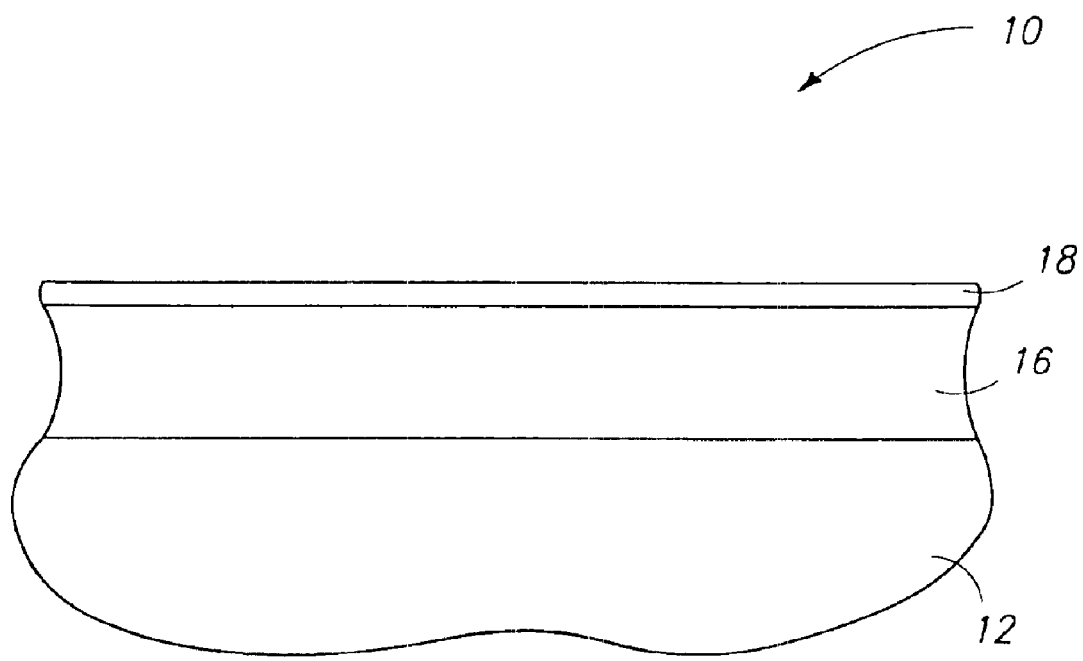
FIG. 1 is a diagrammatic sectional view of a wafer fragment at one processing step in accordance with the invention.

A semiconductor wafer in process in accordance with one aspect of the invention is indicated in FIG. 1 with reference numeral 10. Such comprises a semiconductive substrate in the form of a bulk monocrystalline silicon substrate 12. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. A first capacitor electrode 16 is formed over substrate 12. Exemplary materials include conductively doped polysilicon or TiN. An exemplary thickness for layer 16 is from 100 Angstroms to 1500 Angstroms.

Figure 2:
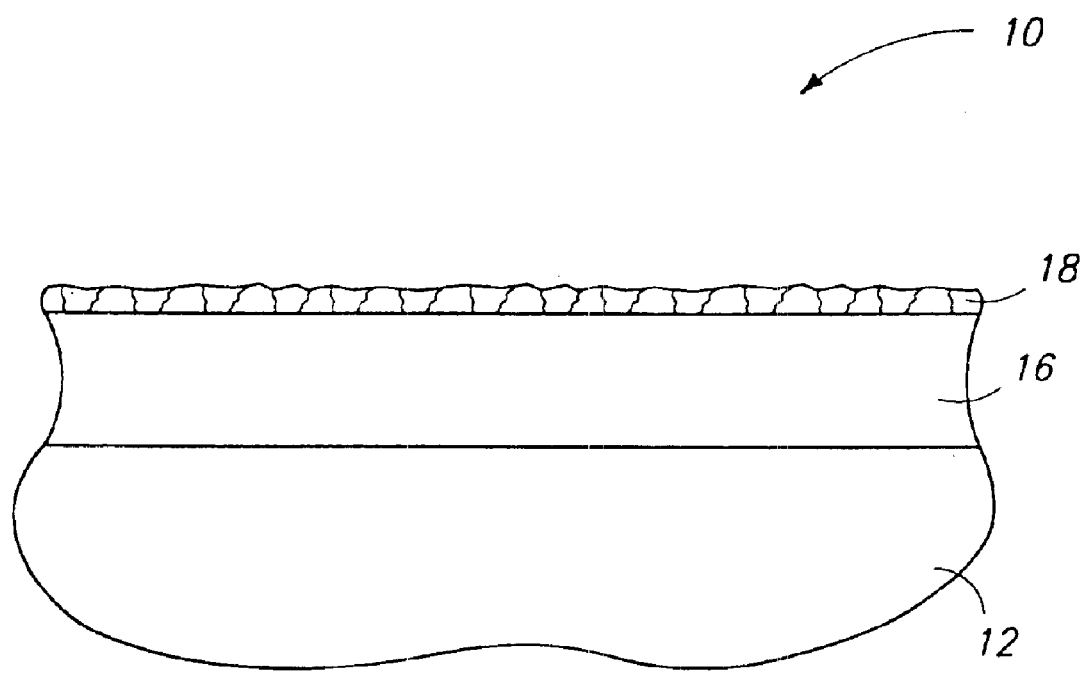
FIG. 2 is a view of the FIG. 1 wafer fragment at a step subsequent to that shown by FIG. 1.

A first layer 18 of a first capacitor dielectric material is formed over first capacitor electrode 16. Exemplary and preferred materials include barium strontium titanate (BST), strontium titanate (ST), strontium bismuth titanate (SBT), lead lanthanate zirconia titanate (PLTZ), $Ta_2O_5$, and mixtures thereof. The preferred method of depositing layer 18 is by chemical vapor deposition. Layer 18 as initially formed can be either crystalline or amorphous, with an initial amorphous structure being preferred and shown in the fabrication of a capacitor dielectric layer in accordance with this aspect of the invention. Regardless, first layer 18 of first capacitor dielectric material is preferably subsequently annealed at a temperature of at least 300° C. for a time period sufficient to achieve a selected crystalline structure intended to densify and facilitate capacitive properties of such material (FIG. 2). Exemplary anneal conditions include a temperature range of from about 300° C. to about 1200° C. at a pressure of from about 2 mTorr to about 5 atm for a treatment time of anywhere from about 1 minute to 2 hours. Unfortunately as described above with respect to the prior art, such annealing can cause sufficient recrystallization to form singular grains at various locations throughout layer 18 having grain boundaries which extend from one surface of the layer to the other, as shown.

Figure 3:
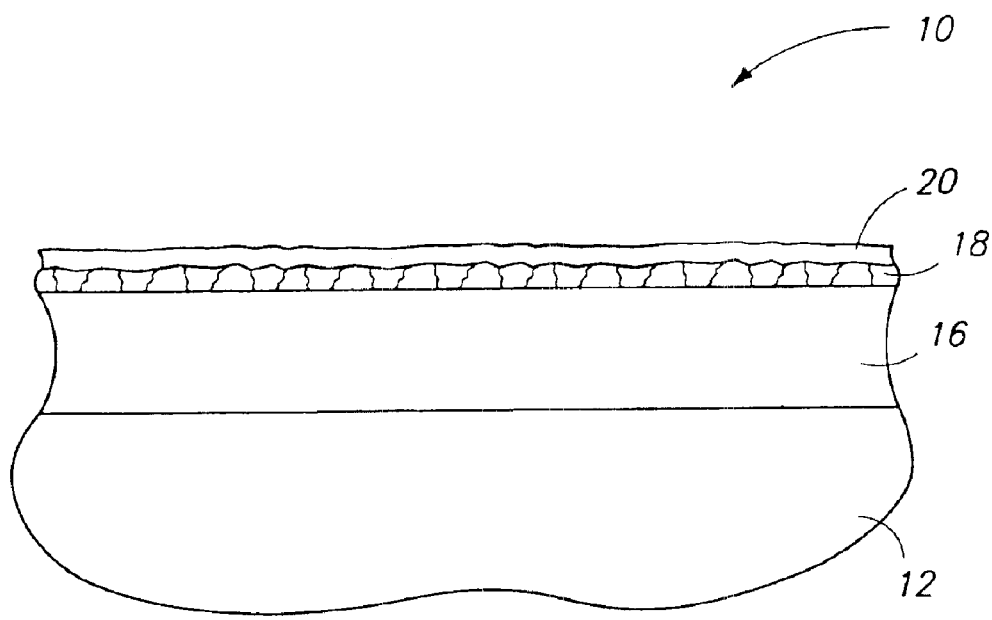
FIG. 3 is a view of the FIG. 1 wafer at a processing step subsequent to that shown by FIG. 2.

Referring to FIG. 3, a second layer 20 of the same first capacitor dielectric material of layer 18 is formed on first layer 18 after the preferred layer 18 annealing. Second layer 20 is also preferably chemical vapor deposited, and can initially be formed to be amorphous or crystalline. Preferably, it is initially formed to be amorphous as shown. Further, the thickness of first layer 18 of the first material is preferably chosen to be from about 10% to about 90% of the finished combined thickness of first layer 18 and second layer 20. An exemplary thickness range for the combination of layers 18 and 20 is from 60 Angstroms to 1000 Angstroms. By way of example only where the material of layers 18 and 20 comprises BST, an example thickness for each layer 18 and 20 is 150 Angstroms.

Figure 4:
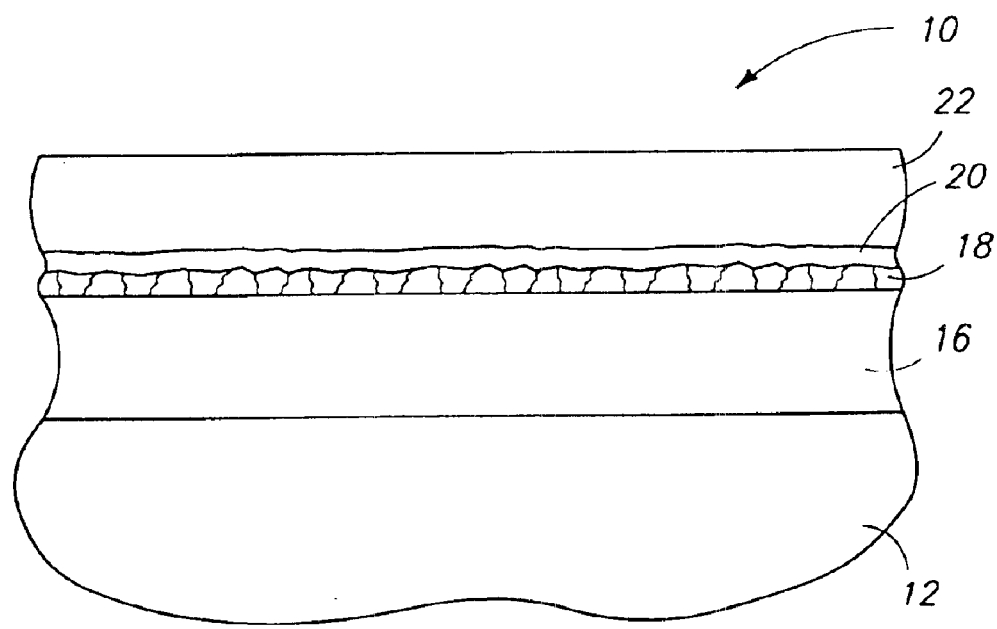
FIG. 4 is a view of the FIG. 1 wafer at a processing step subsequent to that shown by FIG. 3.

Referring to FIG. 4, a second capacitor electrode 22 is formed over: second layer 20 of the first capacitor dielectric material. An exemplary thickness range for electrode 22 is from 100 Angstroms to 2500 Angstroms. Further, diffusion barrier layers, if desired, can be positioned anywhere intermediate the composite of layers 18 and 20, and first electrode 16 and second electrode 22. Regardless, it is most preferable that second layer 20 of the first material not be exposed to a temperature of 500° C. or greater before deposition of any subsequent layer thereover. In certain instances, exposure to such temperature for a sufficient period of time could cause complete crystal realignment relative to the composite layer of layers 18 and 20, and undesirably form grain boundaries which extend from the base of layer 18 clear through to the top of layer 20.

Electrode layer 22 and/or any intervening diffusion barrier or other layer provided over layer 20 are chosen and deposited in such a way that a degree of desired stress (either tensile or compressive) will be imparted into layer 20, either during formation/deposition or subsequently such as when it is heated. Such stress can be imparted inherently by the electrode material during its deposition, or by choosing deposition/forming conditions that themselves impart a desired stress. For example, selection of temperature and pressure conditions during deposition/formation of the electrode layer can be selected to impart a desired stress regardless of the electrode material being deposited. Alternately, the material can be chosen relative to the second capacitor dielectric layer to impart a desired tensile or compressive stress. Such example materials for use with the preferred titanates and pentoxides capacitor dielectric layers include $TiN_x$, $WN_x$, $TaN_x$, $PtRh_x$, $PtRu_x$, $PtIr_x$, and mixtures thereof. Further alternately, and by way of example only, the second capacitor electrode material could be doped with a conductivity enhancing impurity during its formation chosen to achieve a selected stress on the second layer of the capacitor dielectric layer.

Regardless, such stress can largely prevent complete recrystallization of the same material of layers 18 and 20. Exemplary dedicated anneal conditions include temperatures ranging from 500° C. to 1000° C., and pressures ranging from 50 mTorr to 50 atmospheres. Accordingly, layer 20 is preferably ultimately annealed either with a dedicated anneal step or in conjunction with other wafer processing to render it substantially crystalline in its finished composition. Regardless, the preferred capacitor construction will comprise a pair of capacitor electrodes having capacitor dielectric material therebetween comprising a composite of two immediately juxtaposed and contacting, yet discrete, layers: of the same capacitor dielectric material, as shown.

Figure 5:
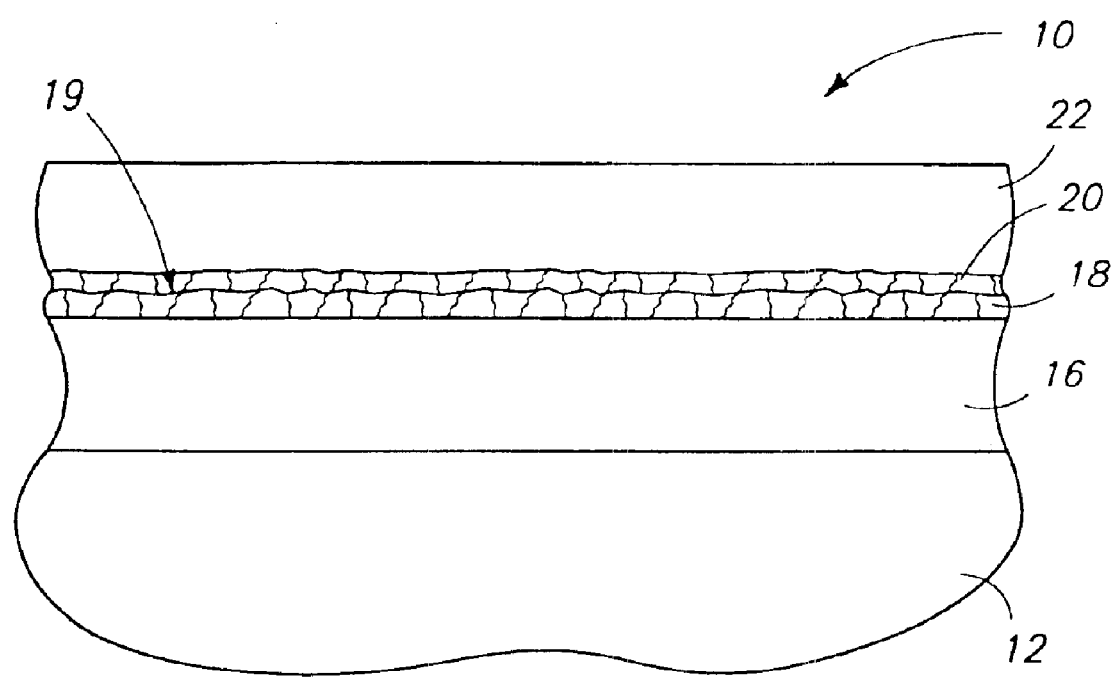
FIG. 5 is a view of the FIG. 1 wafer at a processing step subsequent to that shown by FIG. 4.

Accordingly in the above described preferred embodiment, first layer 18 of the capacitor dielectric layer material is essentially provided with a selected finished crystalline structure prior to formation of second layer 20 thereon. Such is achieved by the crystallization or recrystallization anneal immediately prior to formation of layer 20. Also in the preferred embodiment, the final composition of second layer 20 of the first material is also desirably formed to be crystalline, although alternately such could remain amorphous if so initially deposited. In the preferred embodiment for a capacitor dielectric layer where both of layers 18 and 20 are crystalline in their final form, an interface line 19 essentially forms therebetween where such discrete layers contact (FIG. 5). Interface line 19 is characterized by a perceptible change in crystallinity from one layer to the other, such as shown or evidenced in this example by a substantial lateral shift or displacement in grain boundaries from one layer to the other.

In accordance with another implementation of the invention, first layer 18 can comprise a first titanate compound and second layer 20 can comprise a different second titanate compound. In accordance with still another implementation of the invention, first layer 18 can comprise one capacitor dielectric layer material and second layer 20 can comprise another different capacitor dielectric layer material, with one of the materials comprising a titanate compound and the other comprising $Ta_2O_5$. By way of example only, example titanate compounds are those referred to above.

Fluorine or other grain boundary passivation treatments can also be conducted relative to the first and second layers of material intermediate or after such layers have been deposited. Example such treatments are described in our U.S. Pat. No. 5,665,611 and references cited therein.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A capacitor comprising a pair of capacitor electrodes having capacitor dielectric material therebetween comprising a composite of two immediately juxtaposed and contacting, yet discrete, layers of the identical capacitor dielectric composition comprising a member selected from the group consisting of a strontium titanate, a strontium bismuth titanate, a lead lanthanate zirconia titanate, and mixtures thereof, both of the discrete layers being crystalline, and comprising an interface where the discrete layers contact which is characterized by a perceptible change in crystallinity from one layer to the other, the perceptible change in crystallinity being characterized by a perceptible interface line between the two discrete layers and a perceptible lateral shift in grain boundaries from the one layer to the other.

2. The capacitor of claim 1 wherein the identical capacitor dielectric composition further comprises a barium strontium titanate compound.

3. The capacitor of claim 1 wherein the identical capacitor dielectric composition further comprises $Ta_2O_5$.

4. The capacitor of claim 1 constituting an entire capacitor dielectric region between the pair of capacitor electrodes, the entire capacitor dielectric region consisting essentially of the composite of the two immediately juxtaposed and contacting, yet discrete, layers of the identical capacitor dielectric composition.

5. The capacitor of claim 2 constituting an entire capacitor dielectric region between the pair of capacitor electrodes, the entire capacitor dielectric region consisting essentially of the composite of the two immediately juxtaposed and contacting, yet discrete, layers of the identical capacitor dielectric composition.

6. The capacitor of claim 3 constituting an entire capacitor dielectric region between the pair of capacitor electrodes, the entire capacitor dielectric region consisting essentially of the composite of the two immediately juxtaposed and contacting, yet discrete, layers of the identical capacitor dielectric composition.

7. The capacitor of claim 1 wherein at least one of the electrodes predominately comprises a material selected from the group consisting of $TiN_x$, $WN_x$, $TaN_x$, $PtRh_x$, $PtRu_x$, $PtIr_x$, and mixtures thereof.

8. The capacitor of claim 7 constituting an entire capacitor dielectric region between the pair of capacitor electrodes, the entire capacitor dielectric region consisting essentially of the composite of the two immediately juxtaposed and contacting, yet discrete, layers of the identical capacitor dielectric composition.

9. The capacitor of claim 1 wherein one of the two layers has a thickness of from 10% to 90% of a combined thickness of the two layers.

10. The capacitor of claim 9 constituting an entire capacitor dielectric region between the pair of capacitor electrodes, the entire capacitor dielectric region consisting essentially of the composite of the two immediately juxtaposed and contacting, yet discrete, layers of the identical capacitor dielectric material.

11. The capacitor of claim 9 wherein at least one of the electrodes predominately comprises a material selected from the group consisting of $TiN_x$, $WN_x$, $TaN_x$, $PtRh_x$, $PtRu_x$, $PtIr_x$, and mixtures thereof.

* * * * *